(12) United States Patent
Gruening-von Schwerin

(10) Patent No.: US 7,898,006 B2
(45) Date of Patent: Mar. 1, 2011

(54) INTEGRATED CIRCUIT HAVING MEMORY CELLS AND METHOD OF MANUFACTURE

(75) Inventor: Ulrike Gruening-von Schwerin, Munich (DE)

(73) Assignee: Qimonda AG, Munich (DE)

( * ) Notice: Subject to any disclaimer, the term of this patent is extended or adjusted under 35 U.S.C. 154(b) by 526 days.

(21) Appl. No.: 11/940,704

(22) Filed: Nov. 15, 2007

(65) Prior Publication Data

US 2009/0127586 A1 May 21, 2009

(51) Int. Cl.
*H01L 29/78* (2006.01)

(52) U.S. Cl. .................. 257/205; 257/331; 257/E29.262; 365/148

(58) Field of Classification Search .................. 257/205, 257/331, E29.262, E27.081, E21.54, E21.645; 365/148
See application file for complete search history.

(56) References Cited

U.S. PATENT DOCUMENTS

2008/0205118 A1\* 8/2008 Gruening-von Schwerin et al. .................... 365/148

FOREIGN PATENT DOCUMENTS

| DE | 102006040238 A1 | 3/2008 |
| DE | 102006051137 A1 | 5/2008 |

\* cited by examiner

*Primary Examiner* — Thomas L Dickey
*Assistant Examiner* — Fazli Erdem
(74) *Attorney, Agent, or Firm* — Dicke, Billig & Czaja, PLLC

(57) ABSTRACT

An integrated circuit having memory cells and a method of manufacture is disclosed. One embodiment provides a switching active volume and a selection transistor coupled in series between a first electrode and a second electrode. The selection transistor is a vertical transistor for at least partially guiding a substantially vertical current flow. The second electrode includes a buried diffused ground plate formed in a substrate. A metal-containing region at least partially contacting the buried diffused ground plate is provided, the metal-containing region at least extending below the selection transistor.

41 Claims, 7 Drawing Sheets

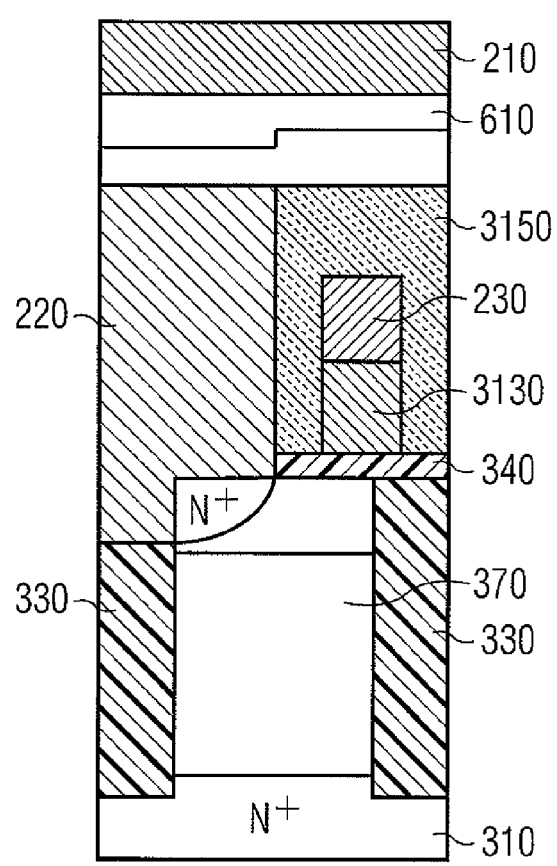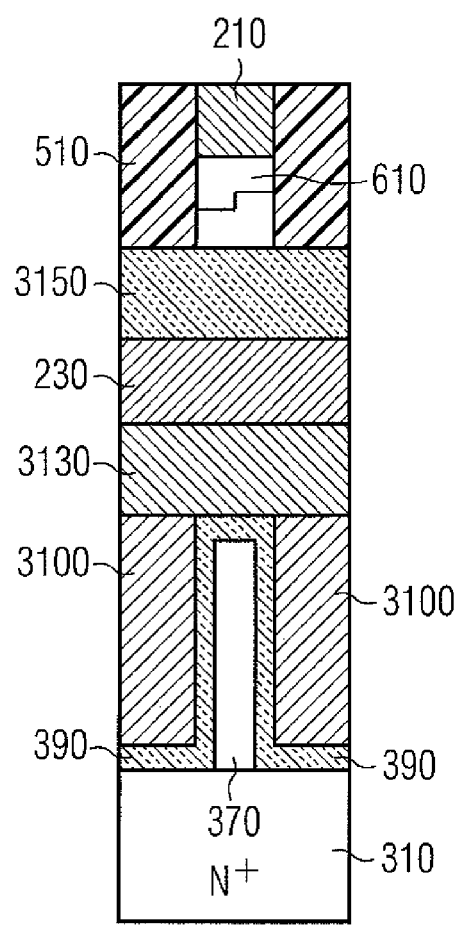

INTEGRATED CIRCUIT HAVING MEMORY CELLS AND METHOD OF MANUFACTURE

BACKGROUND

The present invention relates to an integrated circuit having a memory cell, and a method of manufacture.

In the case of conventional memory devices, one differentiates between functional memory devices (e.g., PLAs, PALs, etc.), and table memory devices, e.g., ROM devices (ROM=Read Only Memory—PROMs, EPROMs, EEPROMs, flash memories, etc.), and RAM devices (RAM=Random Access Memory—e.g., DRAMs and SRAMs).

A RAM device is a memory for storing data under a predetermined address and for reading out the data under this address later. In the case of SRAMs (SRAM=Static Random Access Memory), the individual memory cells consist e.g., of few, for instance 6, transistors, and in the case of DRAMs (DRAM=Dynamic Random Access Memory) in general only of one single, correspondingly controlled capacitive element.

Furthermore, "resistive" or "resistively switching" memory devices have also become known recently, e.g., Phase Change Random Access Memories ("PCRAMs"), Conductive Bridging Random Access Memories ("CBRAMs"), Magnetoresistive Random Access Memories ("MRAM") etc.

In the case of "resistive" or "resistively switching" memory devices, an "active" or "switching active" material—which is, for instance, positioned between two appropriate electrodes—is placed, by appropriate switching processes, in a more or less conductive state (wherein e.g., the more conductive state corresponds to a stored logic "One", and the less conductive state to a stored logic "Zero", or vice versa).

In the case of Phase Change Random Access Memories (PCRAMs), for instance, an appropriate chalcogenide or chalcogenide compound material may be used as a "switching active" material (e.g., a Ge—Sb—Te ("GST") or an Ag—In—Sb—Te compound material, etc.). The phase change material may also be chalcogenide free. The chalcogenide compound material is adapted to be placed in an amorphous, i.e. a relatively weakly conductive, or a crystalline, i.e. a relatively strongly conductive state by appropriate switching processes (wherein e.g., the relatively strongly conductive state may correspond to a stored logic "One", and the relatively weakly conductive state may correspond to a stored logic "Zero", or vice versa). Phase change memory cells are, for instance, known from G. Wicker, "Nonvolatile, High Density, High Performance Phase Change Memory", SPIE Conference on Electronics and Structures for MEMS, Vol. 3891, Queensland, 2, 1999, and e.g., from Y. N. Hwang et al., "Completely CMOS Compatible Phase Change Nonvolatile RAM Using NMOS Cell Transistors", IEEE Proceedings of the Nonvolatile Semiconductor Memory Workshop, Monterey, 91, 2003, S. Lai et al., "OUM—a 180 nm nonvolatile memory cell element technology for stand alone and embedded applications", IEDM 2001, Y. Ha et al., "An edge contact type cell for phase change RAM featuring very low power consumption", VLSI 2003, H. Horii et al., "A novel cell technology using N-doped GeSbTe films for phase change RAM", VLSI 2003, Y. Hwang et al., "Full integration and reliability evaluation of phase-change RAM based on 0.24 μm-CMOS technologies", VLSI 2003, and S. Ahn et al., "Highly Manufacturable High Density Phase Change Memory of 64 Mb and beyond", IEDM 2004, etc.

In the case of the above Conductive Bridging Random Access Memories (CBRAMs), the storing of data is performed by use of a switching mechanism based on the statistical bridging of multiple metal rich precipitates in the "switching active" material. Upon application of a write pulse (positive pulse) to two respective electrodes in contact with the "switching active" material, the precipitates grow in density until they eventually touch each other, forming a conductive bridge through the "switching active" material, which results in a high-conductive state of the respective CBRAM memory cell. By applying a negative pulse to the respective electrodes, this process can be reversed, hence switching the CBRAM memory cell back in its low-conductive state. Such memory components are e.g., disclosed in Y. Hirose, H. Hirose, J. Appl. Phys. 47, 2767 (1975), T. Kawaguchi et al., "Optical, electrical and structural properties of amorphous Ag—Ge—S and Ag—Ge—Se films and comparison of photoinduced and thermally induced phenomena of both systems", J. Appl. Phys. 79 (12), 9096, 1996, M. Kawasaki et al., "Ionic conductivity of $Ag_x(GeSe3)_{1-x}$ (0<x0.571) glasses", Solid State Ionics 123, 259, 1999, etc.

Correspondingly similar as is the case for the above PCRAMs, for CBRAM memory cells an appropriate chalcogenide or chalcogenide compound (for instance GeSe, GeS, AgSe, CuS, etc.) may be used as "switching active" material.

In the case of PCRAMs, in order to achieve, with a corresponding PCRAM memory cell, a change from the above-mentioned amorphous, i.e. a relatively weakly conductive state of the switching active material, to the above-mentioned crystalline, i.e. a relatively strongly conductive state of the switching active material, an appropriate relatively high heating current pulse has to be applied to the electrodes, the heating current pulse resulting in that the switching active material is heated beyond the crystallization temperature and crystallizes ("writing process").

A change of state of the switching active material from the crystalline, i.e. a relatively strongly conductive state, to the amorphous, i.e. a relatively weakly conductive state, may, for instance, be achieved in that—again by an appropriate (relatively high) heating current pulse—the switching active material is heated beyond the melting temperature and is subsequently "quenched" to an amorphous state by quick cooling ("erasing process").

Typically, the above erase or write heating current pulses are provided via respective source lines and bit lines, and respective FET or bipolar access transistors associated with the respective memory cells, and controlled via respective word lines.

To be cost competitive, a small cell size is desired, requiring a high density of the memory cell array. With planar array transistors, or with a transistor where the source/drain contacts are lying in the same horizontal plane (for example: FinFET), the cell size is limited to 6F2 for geometrical reasons.

There exists a need for a memory device including nonvolatile memory cells of a small cell size.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 3 illustrates a cross-section through a double gate transistor of FIG. 2 in a bit line direction.

FIG. 4 illustrates a cross section through the double gate transistor of FIG. 2 in a word line direction.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
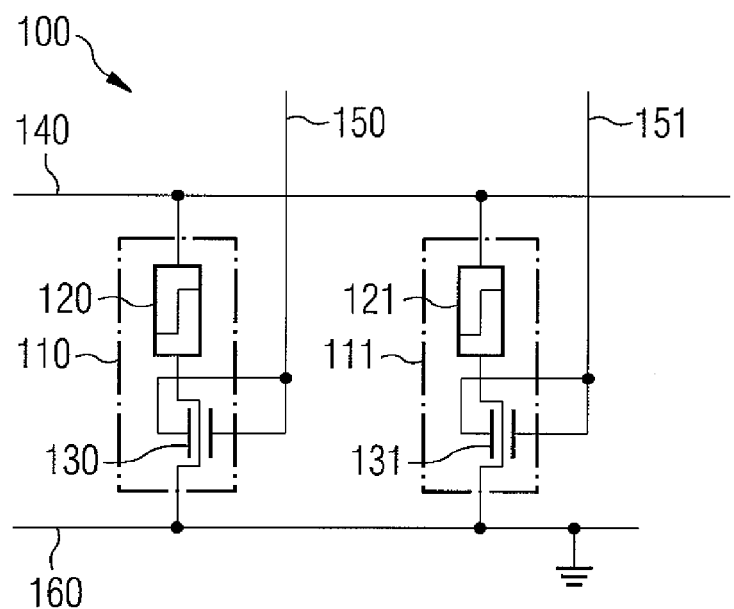
FIG. 1 illustrates a schematic circuit diagram of two memory cells representing an array of several memory cells using double gate transistors.

FIG. 1 illustrates one embodiment of an electrical circuit 100. A first and a second memory cell, each surrounded by a dotted line 110 and 111 respectively, exemplify a plurality of identical memory cells arranged in an array.

Each memory cell 110, 111 includes a memory element 120, 121 and a selection transistor 130, 131. In this drawing and throughout the described or other embodiments, the memory element can be any type of memory element, in one embodiment, resistively switching memory element, for example a volume of phase change material of a PCRAM memory cell or a volume of suitable material of a conducting bridge CBRAM memory cell or of an MRAM cell. Still, other types of cells are possible, including ferroelectric cells, for example.

The memory elements 120, 121 are coupled to a bitline 140 with their one end and to the selection transistor 130, 131 of the corresponding memory cell with their residual end.

As indicated in the drawing the selection transistors 130, 131 are double gate transistors, wherein the two gates of a transistor are arranged on opposing sidewalls of the active area of the transistor. Also the transistors are vertical transistors as will be explicated in the following in more detail, wherein vertical describes that—with the original wafer surface serving as a horizontal reference plane throughout the description—the current flows vertically or in other words the drain is arranged substantially vertically above the active area being in turn substantially vertically arranged above the source of a transistor. The gate electrodes of one transistor are coupled to the same word line that is the gate electrodes of transistor 130 are coupled to a first word line 150 and the gate electrodes of transistor 131 are coupled to a second wordline 151.

Further on the transistors 130, 131 are coupled with their source to a ground line 160 being, as will be explicated in more detail below, a ground plate electrode and which is typically a doped layer in the wafer serving as a ground line for all selection transistors. In this way the ground plate electrode is buried below the surface level of the original wafer. The semiconductor material in which the above-noted transistors are formed may then be deposited, epitaxially regrown, or otherwise formed thereon.

Furthermore it is to be noted that the two memory cells are representative for a plurality of memory cells of a memory device wherein the cells are arranged in an array with a plurality of bit lines and word lines for operating the cells. A plurality of memory cells is coupled to one bitline and a plurality of cells is coupled to one wordline running in a direction orthogonal to the bitline, wherein an individual memory cell is coupled to a pair of a bit line and a word line, so that each cell can be selected by selecting the appropriate bit line and word line.

Figure 2:
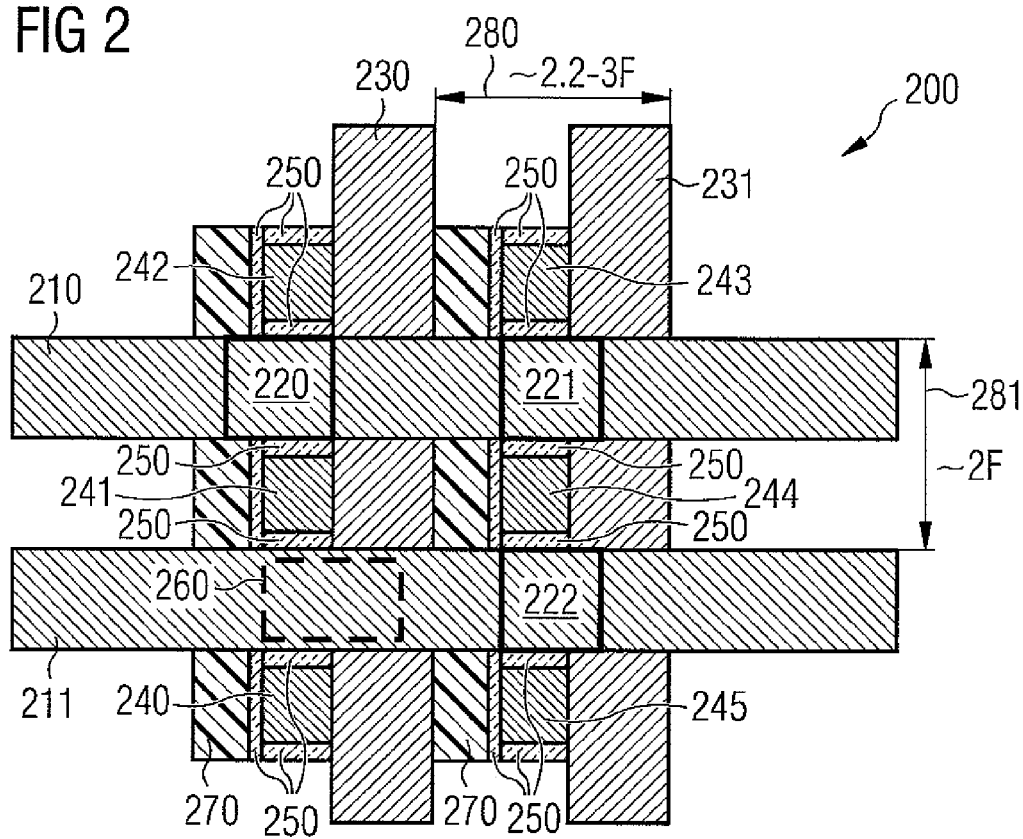
FIG. 2 illustrates a schematic top-down view onto a cut-out of a layout of an array of memory cells using double gate transistors.

FIG. 2 illustrates a schematic top-down view onto a cutout of a layout of an array 200 of memory cells including the double gate selection transistors.

In this drawing the insulation material separating and insulating elements is partly omitted for reasons of clearness. It is obvious for those skilled in the art that elements, for example bit lines or word lines drawn as separate lines, are embedded in any suitable dielectric to insulate these against adjacent elements.

Also some elements for resistively switching memory cells, for example such as volumes of resistively switching material, are not illustrated, as they are hidden by other elements located above them. Furthermore the ground plate electrode, onto which the structure is formed, is omitted in this drawing.

A first and a second bit line 210, 211 being the topmost elements in this top-down view are exemplifying a plurality of identical bitlines being positioned adjacent and parallel to these. Each bit line 210, 211 is coupled to a plurality of memory elements of memory cells, which may be for example volumes of phase change material. These memory elements—hidden under the bit lines and thus not visible in this view—are coupled to an active area 210, 211 via contacts 220, 221, 222 wherein the location of a contact is schematically indicated by a framed quadrangle.

Word lines 230, 231 exemplify a plurality of parallel word lines being perpendicular to and located below the bit lines 210, 211. As mentioned afore each word line is coupled to a plurality of gate electrodes 240-245, that is word line 230 is coupled to gate electrodes 240, 241 and 242 and word line 231 is coupled to gate electrodes 243-245. The gate electrodes 240 and 241 serve as gate electrodes for an active area of a transistor located between these gate electrodes. Thus the gate electrodes are located at opposing sidewalls of the active area of the transistor. The gate electrodes are insulated by gate oxide 250 against the active area, whose approximate location and shape are indicated by the dotted line 260. As indicated the shape of the active area is an elongated quadrangle sandwiched between gate electrode 240 and gate electrode 241 in one direction and by a shallow trench isolation 270 (STI) in the perpendicular direction (e.g., a shallow isolation trench manufactured by a STI method) whereby a comparatively thin layer of gate oxide 250 is located between gate electrodes and active area. Although it is not necessary to have the gate oxide between the gate electrode and the STI, it may be formed that way.

A transistor including active area 260 furthermore includes gate electrodes 240 and 241, which are coupled to word line 230. The top of the active area 260 is coupled to a memory element—not illustrated—, which in turn is coupled via a bit line contact to bit line 211, wherein the location of the bit line contact is similar to those of 220. The lower end of active area 260 being the source of the transistor is coupled to the ground plate electrode, which is the lowest element and thus invisible in this drawing.

Even though the drawing is not drawn to scale arrow 280 indicates that the periodicity of the word lines is 2.2 to 3F in the illustrative embodiment and arrow 281 indicates the periodicity of the bit lines being 2F, wherein F denotes the minimum feature size defined by the manufacturing method used. Consequently the size of the illustrative memory cell is between 4.4 to 6 F2.

Also the approximate size of an active area is defined by the periodicity of the bit—and the word lines. According to current production capabilities a width of 1F is required for a bit- or a word line, thus the area of an active area is approximately 1.2-2 by 1 F resulting in an area of 1.2-2 F2. Advances in the art of metallurgy and lithography, among others, may change these relative dimensions.

FIG. 3 illustrates the active area 370 of a transistor, the lower region being connected to a ground plate electrode 310. The upper region of the active area 370 may have been N+ implanted, either the entire upper region or only in part as indicated by the quarter-circle, which connects to contact 520, which in this case is the bottom contact to a volume of resistively switching material 610, which in turn connects to a bit line 210.

In this view the sidewalls of active area 370 abut against insulation trenches forming a shallow trench isolation (STI) (also called an isolation trench) and which in this view run into the paper plane. The top surface of the active area 370 is partly covered by contact 220, to which it connects, and partly covered by residuals of the insulating thick oxide layer 340. The thick oxide layer 340 insulates the gate conductor stack including a line of SiO 3130 and a line of a good conducting material such as a metal forming the wordline 230. The top surface of the gate conductor stack is insulated by a layer of SiN 3150, the sidewalls being insulated by gate conductor spacers.

FIG. 4 is a schematic view of a cross-section in word line direction through an active area of a transistor and a gate conductor stack. The gate conductor stack including poly silicon line 3130, the word line 230 and the insulating layer 3150 partly overlap the top surface of an active area 370 of a transistor. The cut line in this drawing crosses the overlapping area.

An active area 370 emerges from ground plate electrode 310. A first and a second gate electrode 3100 of a conducting material, in one embodiment poly silicon, are located at the left and right sidewall of the active area 370, insulated by a liner of gate dielectric or gate oxide 390 such as SiO. The two gate electrodes 3100 thus forming a dual or double gate for the transistor. The gate electrodes 3100 is coupled to word line 230 via the poly silicon 3130 of the gate conductor stack.

It is to be noted that both gate electrodes not only serve as gate electrodes for the active area 370 visible in this drawing. Each gate electrode furthermore serves as a gate electrode for another adjacent active area. That is, the gate electrode on the left hand side of active area 370 serves as a gate electrode for the visible active area 370 and also as gate electrode for an active area adjacent to the left side of the gate electrode. Similarly the gate electrode on the right hand side of active area 370 also serves as gate electrode for the next adjacent active area to the right hand side. In this way a plurality of gate electrodes 3100 is coupled to a single word line 230, whereby two gate electrodes form a double gate electrode for one transistor.

Although the drawings are not drawn to scale it is to be noted that the bottom surface of the active area 370 does not have to be a square. When comparing the shapes of an active area 370 of FIG. 3 to that in FIG. 4 it is clear that the shape of the bottom surface of an active area 370 is an elongated quadrangle with the length in word line direction being smaller than the length in bit line direction.

Figure 5:
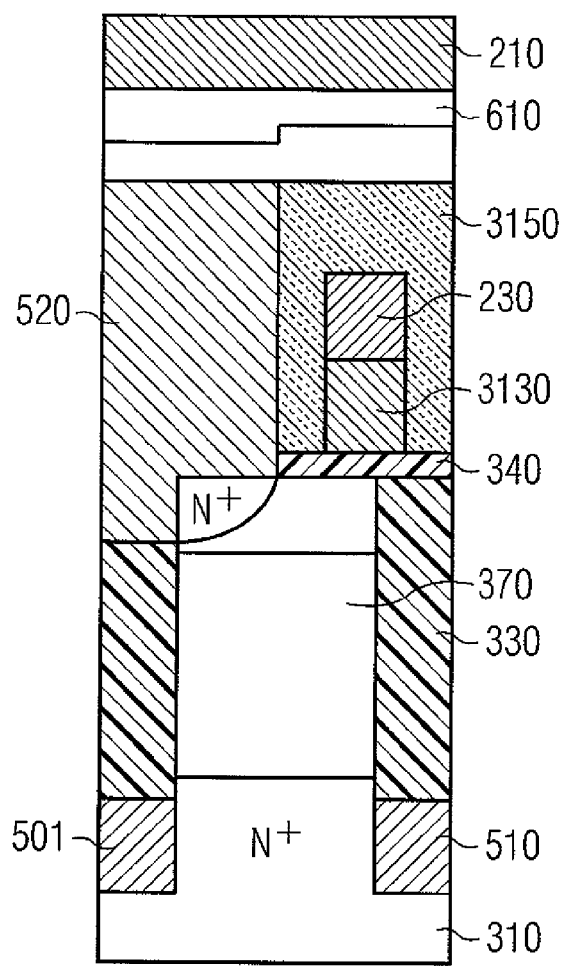
FIG. 5 illustrates a cross-section through another double gate transistor in a bit line direction.
Figure 6:
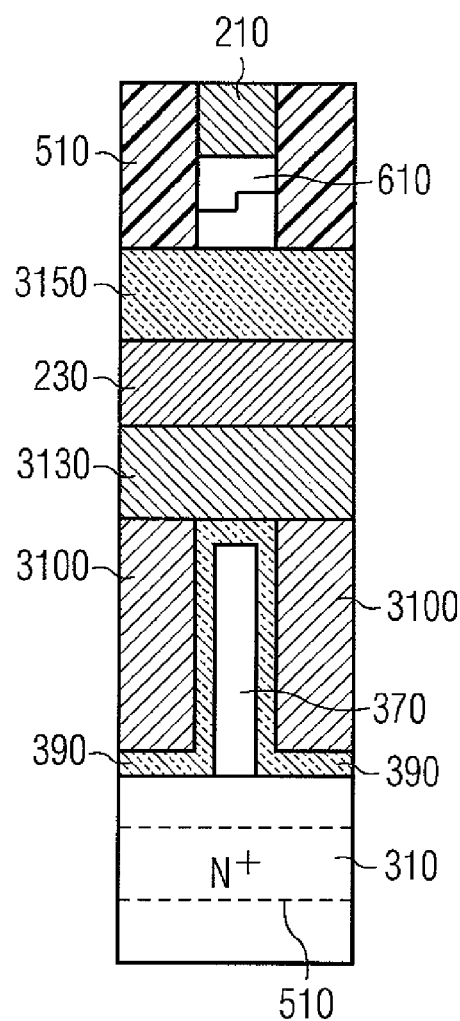
FIG. 6 illustrates a cross section through the another double gate transistor of FIG. 5 in a word line direction.

FIGS. 5 and 6 illustrate cuts through the active area in the bitline direction (FIG. 5) and through the gate contact in the wordline direction (FIG. 6) in views similar to FIGS. 3 and 4. In this embodiment there now additionally exists a metal region/line 501 buried below each STI (with only its position illustrated in dash lines in FIG. 6). By creating these buried metal lines 501, the conductivity of the ground plate 310 is greatly enhanced without a need for extensive and area consuming stitching of plate-to-BEOL-metal wires. Further, the metal-containing ground plate 310 is formed cost effectively without a need of additional lithography steps by using existent isolation trenches 330 which separate the active silicon regions of adjacent cells and which generally may contain at least parts of the gate electrode and wordline. The wiring is continuously running in at least one direction.

Figure 7:
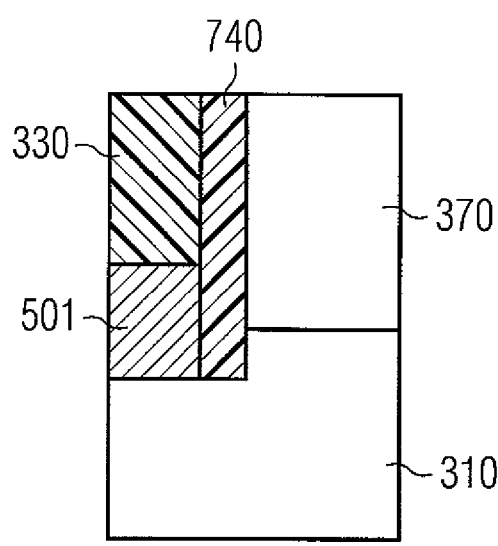
FIG. 7 illustrates a cut out view through another double gate transistor in a bit line direction at a certain process in the vicinity of a buried ground electrode.

The structure of FIGS. 5 and 6 may be created in one embodiment by performing a shallow trench isolation lithography and etch with the STI 330 depth reaching into the buried plate 310. To introduce the metal wiring 501, a metal fill is performed, the metal containing W and/or TiN in this exemplary case, with still others being possible. This is followed by performing a recess of the metal fill, e.g., to the depth of the buried ground plate 310. After that, a STI 330 fill and subsequent planarization may be performed. The STI fill dielectric may contain a combination of different dielectric materials like oxides and nitrides. In one embodiment, the metal may be covered by a nitride containing liner prior to oxide fill in order to later prevent oxidation of the metal fill. This liner may optionally be removed from the upper portions of the STI trench sidewalls. FIG. 7 illustrates the structure post STI fill in a view similar to FIG. 5 in the vicinity of the metal fill 501.

Further FIG. 7 illustrates an optional dielectric spacer which may consist of oxide or nitride or a combination thereof. 740. Also, the above process may be modified such that a dielectric sidewall spacer is added prior to the metal fill. The spacer may consist of nitride or oxide or a combination thereof. This enables oxidation of the sidewalls prior to metal deposition.

Figure 8:
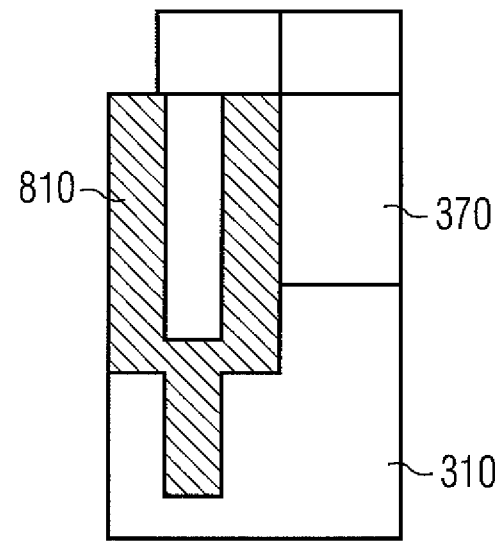
FIG. 8 illustrates a cut out view through a transistor of another embodiment in a bit line direction at a certain process in the vicinity of a buried ground electrode.
Figure 9:
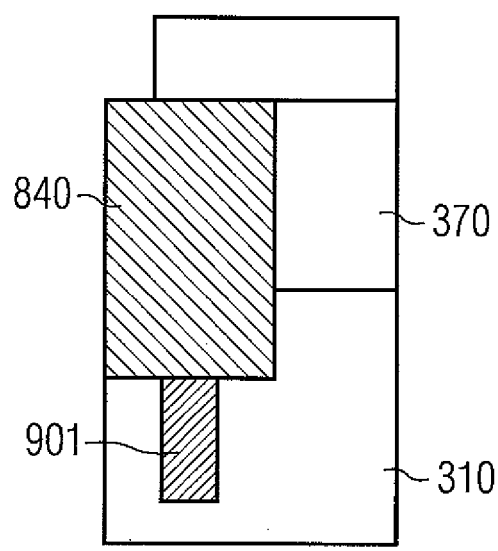
FIG. 9 illustrates a cut-out view through the transistor of FIG. 8 in a bit line direction at a following process step.

FIGS. 8 and 9 illustrate a structure in the vicinity of the buried ground plate 310 for a process sequence for improved recess control by double trench etch. This process sequence also starts with an STI lithography process and Si trench etch. Then, a sacrificial sidewall spacer is added that includes an oxide, SiN, $Al_2O_3$, or any other suitable material or material combination. Subsequently, the STI Si etch is continued, followed by the removal of the sacrificial sidewall spacer, creating a two-process trench. In a following process, a metal-containing (W/TiN) liner 810 is deposited using a divot fill and a subsequent etch back. A divot fill may include completely filling a relatively narrow structure (e.g., a trench or narrower trench) and at least partially filling a relatively broad structure (e.g., a broad recess or broader trench) situated above the narrower structure and subsequent etching of the filling material such that within the narrower structure this material completely remains. Optionally, a SiN liner deposition may follow, which may be removed along the upper trench sidewalls. Lastly, a STI fill and a planarization are performed. FIG. 8 illustrates the structure in the vicinity of the ground plate 310 post metal liner 810 fill. FIG. 9 illustrates the same region of the memory cell as in FIG. 8 but post isolation dielectric fill wherein a subsequent metal wiring 901 is arranged below the STI 840.

Figure 10:
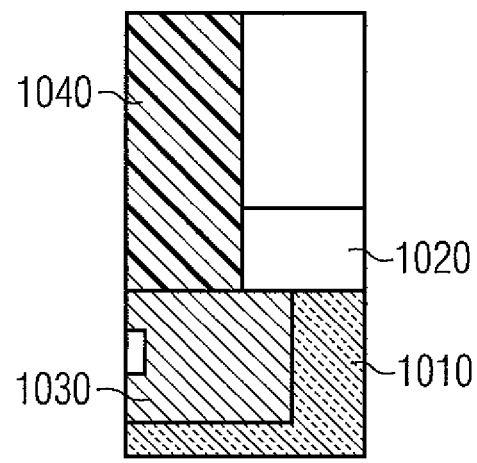
FIG. 10 illustrates a cut out view through a transistor of even another embodiment in a bit line direction at a certain process in the vicinity of a buried ground electrode.

FIG. 10 illustrates a part of a memory cell structure in the vicinity of the buried ground plate 1010 for a certain portion of a process sequence detailed below. This process sequence relates to memory cells using SOI ("silicon on insulator") substrates. This process sequence also starts with a STI lithography and Si trench etch but stops on a SOI BOX oxide 1010. It follows a partially isotropic oxide etch (combination) into the BOX oxide 1010. This process may be preceded by the creation of a sidewall spacer, especially one containing SiN or $Al_2O_3$. Following the isotropic etch, a metal (e.g., W/TiN) fill and recess to the depth of the buried ground plate 1020 is performed thus creating a metal wire /region 1030. If desired, the sacrificial sidewall spacer (liner) can be removed after that. Optionally, a SiN containing liner deposition can be performed. Lastly, a STI 1040 fill and planarization are performed. Generally, the wiring may be completely embedded in the doped plate or may be at least partially located in the bottom oxide of the SOI-substrate, contacting a ground plate Si situated above. FIG. 10 illustrates the SOI structure post STI fill.

FIG. 10 illustrates a corresponding SOI structure in the vicinity of the buried ground plate 1010 but post STI fill.

Figure 11:
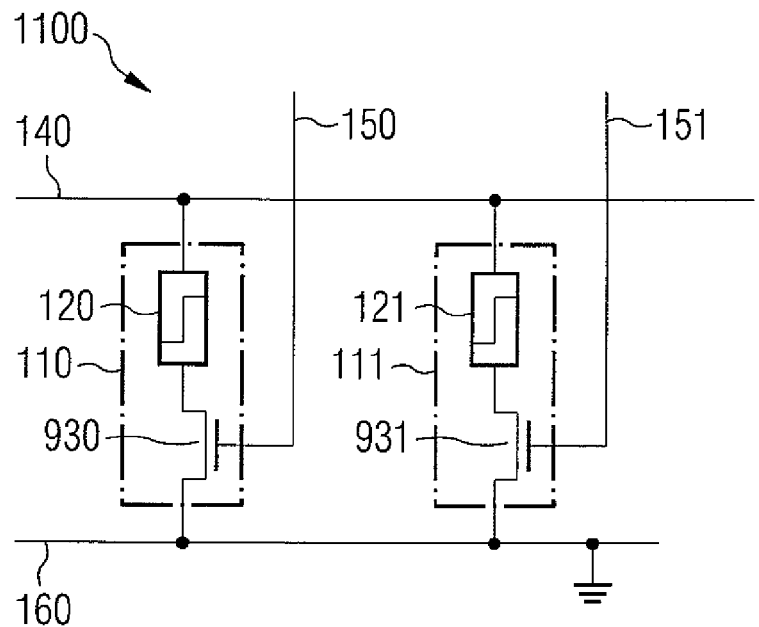
FIG. 11 illustrates a schematic circuit diagram of memory cells according to another embodiment representing an array of several memory cells using surrounding gate transistors.

FIG. 11 illustrates an array schematic 1100 of two resistively switching memory cells 1110 and 1120, resp., in a view similar to the one of FIG. 1. In contrast to the embodiment of FIG. 1, the resistively switching memory cells 1110 and 1120 are now formed as surrounding gate transistors.

Figure 12:
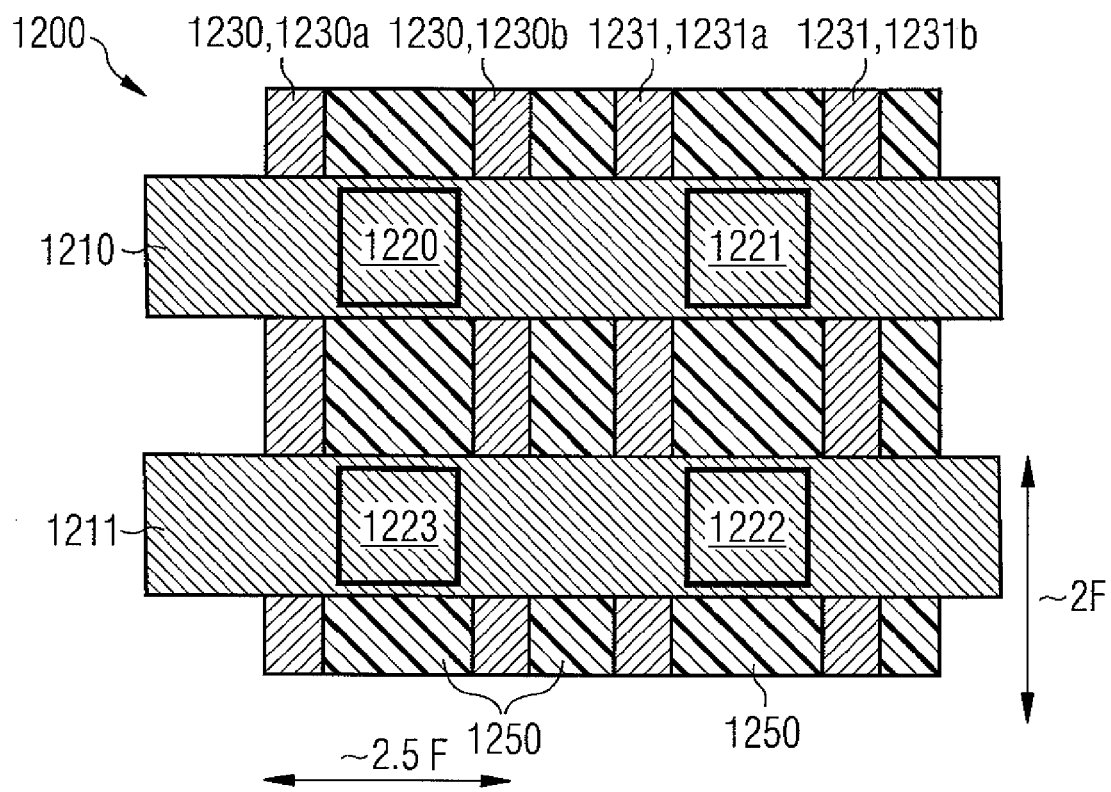
FIG. 12 illustrates a schematic top-down view onto a cut-out of a layout of an array of single gate memory cells according to the embodiment of FIG. 11.

FIG. 12 illustrates a simplified array layout 1200 basically corresponding to the exemplary embodiment of array layout 1100 in FIG. 11 in a top-down view similar to the one of FIG. 2. Here, the active areas 1220, 1223 of the surrounding gate transistors are activated by a wordline 1230 and the active areas 1221, 1222 are activated by a wordline 1231. Similar in function to the double gate transistors are bitlines 1210, 1211 and a gate oxide 1250. The word lines 1230, 1231 are each formed as spacer wordlines 1230a, 1230b and 1231a, 1231b, resp., i.e., the wordline 1230, 1231 is split into a pair of two sub-wordlines (the spacer wordlines) that run around the sidewalls of an active area 1220, 1223 and 1221, 1222, resp. and that are activated simultaneously.

Figure 13:
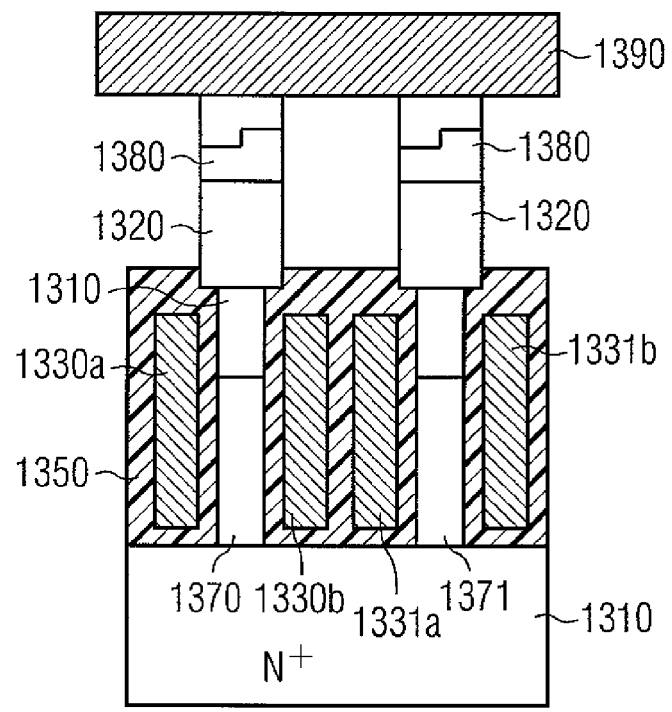
FIG. 13 illustrates a cross-section through a surrounding gate transistor of FIG. 12 in a bit line direction.

FIG. 13 illustrates a surrounding gate transistor cell 1300 as a cut-through view in the bitline direction of the layout structure of FIG. 12. In this conventional layout, the conductivity of the ground plate 1310 is mainly governed by the doping of the ground plate 1310 and by setting its depth. The active area 1370 may be simultaneously activated by the spacer wordline 1330a, 1330b, and the active area 1371 may be simultaneously activated by the spacer wordline 1331a, 1331b. The spacer wordlines 1330a, 1330b, 1331a, 1331b and the active areas 1370 1371 are surrounded by a shallow trench isolation 1350. Above the active areas 1370, 1371 are arranged respective contacts 1320 which in this case are the bottom contact to corresponding volumes of resistively switching material 1380, which in turn connect to a bit line 1390.

Figure 14:
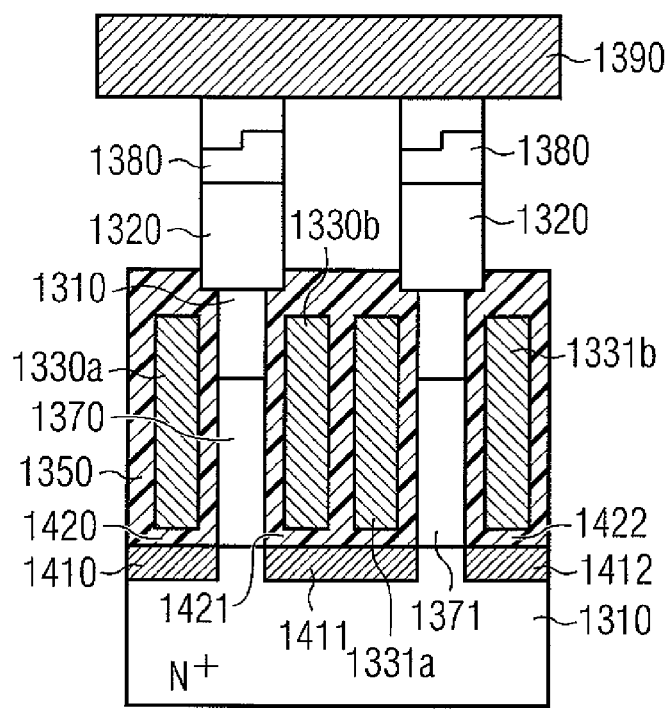
FIG. 14 illustrates a cross-section through another surrounding gate transistor in a bit line direction.

FIG. 14 illustrates the structure of FIG. 13 using the same reference numbers for same structural elements, and further including buried metal lines 1410, 1411, 1142 below the word line trenches 1350. The wordlines 1330, 1331 are separated from the metal lines 1410, 1411, 1412 by a respective trench top oxide layer 1420, 1421, 1422.

Figure 15:
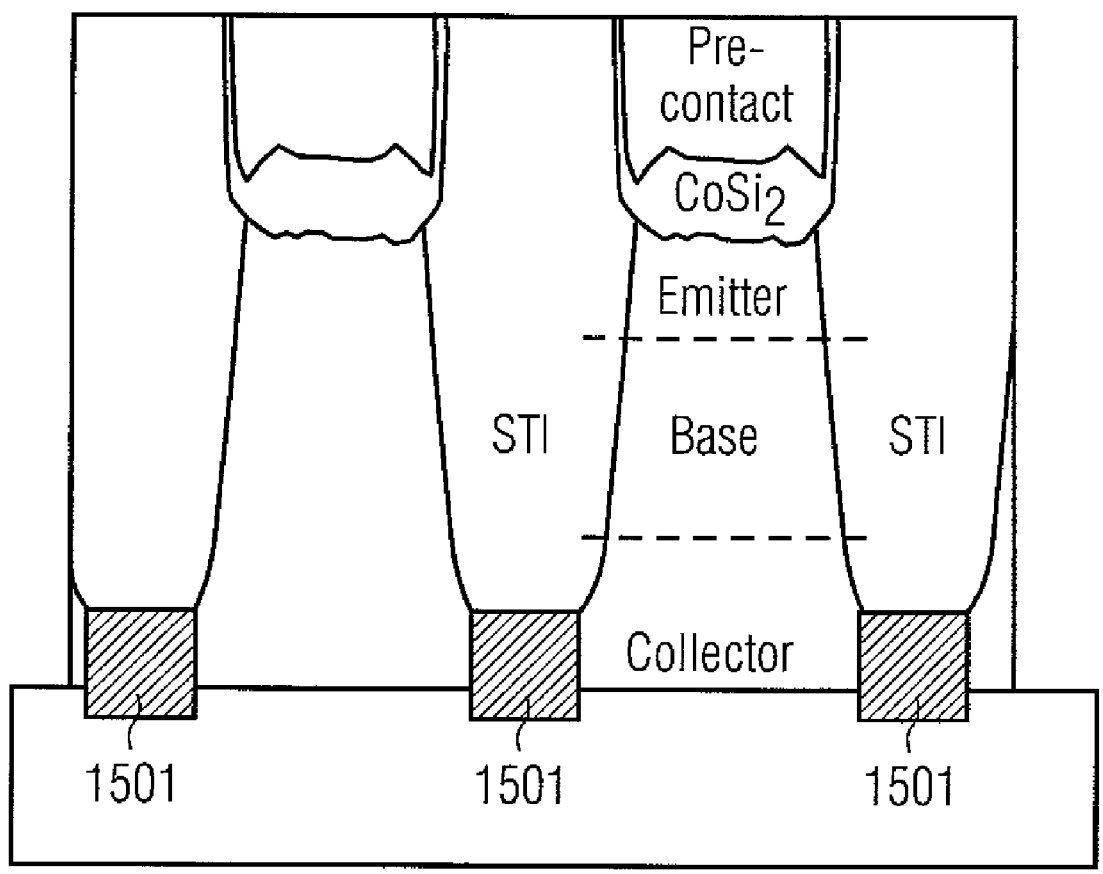
FIG. 15 illustrates a cross-section through a Bipolar Junction Transistor (BJT).

FIG. 15 illustrates a cross-section through HBT transistors according to, e.g., F. Pellizzerl, A. Benvenutil, B. Gleixner et al.: A 90 nm Phase Change Memory Technology for Stand-Alone Non-Volatile Memory Applications; Symp. on VLSI Tech. 2006. Additionally to that there is now present a metal wiring 1501 at the bottom of each STI in a collector plate electrode.

The invention is not limited to the above mentioned embodiments. Rather all variation, modifications and alterations are included that are encompassed in the true spirit and scope of the invention. Generally, an implementation of a low resistive, e.g., metal-containing, wiring into a plate electrode which is buried in the silicon substrate below the selection transistor may be used.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit having a memory cell, comprising:
    a switching active volume and a selection transistor coupled in series between a first electrode and a second electrode;
    wherein the selection transistor is a vertical transistor for at least partially guiding a substantially vertical current flow;
    wherein the second electrode comprises a buried diffused ground plate formed in a substrate; and
    a metal-containing region at least partially directly contacting the buried diffused ground plate, the metal-containing region at least extending below the selection transistor.

2. The integrated circuit of claim 1, wherein the first electrode is a bitline electrode.

3. The integrated circuit of claim 1, wherein the second electrode is a ground electrode.

4. The integrated circuit of claim 1, wherein the metal-containing region is located below an isolation region.

5. The integrated circuit of claim 4, wherein the isolation region comprises an isolation trench.

6. The integrated circuit of claim 4, wherein the isolation region comprises at least parts of at least one of a gate electrode and a word line.

7. The integrated circuit of claim 1, wherein the metal-containing region is at least partially embedded within the buried diffused ground plate.

8. The integrated circuit of claim 7, wherein the metal-containing region is completely embedded within the buried diffused ground plate.

9. The integrated circuit of claim 7, wherein the metal-containing region is partially embedded within the buried diffused ground plate and partially embedded within a non-diffused part of the substrate.

10. The integrated circuit of claim 1, wherein the selection transistor is one of a double gate transistor, a surrounding gate transistor or a bipolar junction transistor.

11. The integrated circuit of claim 1, wherein the substrate comprises a silicon substrate.

12. The integrated circuit of claim 11, wherein the substrate comprises doped silicon.

13. The integrated circuit of claim 1, wherein the substrate comprises a SOI substrate.

14. The integrated circuit of claim 13, wherein the metal-containing region is located at least partially below the ground plate.

15. The integrated circuit of claim 10, wherein the selection transistor is a bipolar junction transistor, comprising a metal wiring in a collector plate electrode.

16. An integrated circuit comprising an array of multiple memory cells, each memory cell comprising:
a switching active volume and a selection transistor connected in series between a first electrode and a second electrode;
wherein the selection transistor is a vertical transistor for at least partially guiding a substantially vertical current flow;
wherein the second electrode comprises a buried diffused ground plate formed in a substrate; and
wherein the integrated circuit further comprises a metal-containing region at least partially directly contacting the buried diffused ground plate, and the second electrode being common to the memory cells of the array.

17. The integrated circuit of claim 16, the metal-containing region at least extending below the selection transistors of the memory cells of the array.

18. The integrated circuit of claim 16, wherein the metal-containing region comprises a metal-containing wiring.

19. The integrated circuit of claim 18, wherein the metal-containing wiring is continuous at least in one direction.

20. The integrated circuit of claim 16, wherein the metal-containing region is located below an isolation region that separates active regions of adjacent memory cells.

21. The integrated circuit of claim 20, wherein the isolation region comprises at least one isolation trench.

22. The integrated circuit of claim 20, wherein the isolation region comprises at least parts of at least one of a gate electrode and a word line.

23. The integrated circuit of claim 16, the metal-containing region being at least partially embedded within the buried diffused ground plate.

24. The integrated circuit of claim 16, wherein the selection transistor is one of a doubled gate transistor, a single gate transistor and a bipolar junction transistor.

25. The integrated circuit of claim 16, wherein the substrate is one of a silicon substrate and a SOI substrate.

26. The integrated circuit of claim 1, wherein the switching active volume is positioned on a first side of the selection transistor and the metal-containing region is positioned on a second side of the selection transistor opposite the first side.

27. The integrated circuit of claim 16, wherein the switching active volume is positioned on a first side of the selection transistor and the metal-containing region is positioned on a second side of the selection transistor opposite the first side.

28. An integrated circuit comprising:
a vertical selection transistor;
a switching active volume coupled to a first side of the selection transistor;
a buried diffused ground plate coupled to a second side of the selection transistor opposite the first side; and
a metal-containing region directly contacting the buried diffused ground plate, the metal-containing region positioned on the second side of the selection transistor.

29. The integrated circuit of claim 28, further comprising:
shallow trench isolation reaching to the buried diffused ground plate.

30. The integrated circuit of claim 29, wherein the metal-containing region directly contacts the shallow trench isolation.

31. The integrated circuit of claim 28, wherein the metal-containing region comprises one of W and TiN.

32. The integrated circuit of claim 28, further comprising:
a bit line coupled to the switching active volume.

33. The integrated circuit of claim 32, further comprising:
a word line coupled to a gate of the selection transistor.

34. The integrated circuit of claim 33, wherein the bit line is perpendicular to the word line.

35. The integrated circuit of claim 28, further comprising:
a contact coupling the selection transistor to the switching active volume.

36. The integrated circuit of claim 28, wherein the selection transistor comprises a double gate transistor.

37. The integrated circuit of claim 28, wherein the selection transistor comprises a surrounding gate transistor.

38. The integrated circuit of claim 28, wherein the selection transistor comprises a gate electrode that serves as a gate electrode for another adjacent selection transistor.

39. The integrated circuit of claim 38, further comprising:
poly silicon coupling the gate electrode to a word line.

40. The integrated circuit of claim 28, wherein the switching active volume comprises resistively switching material.

41. The integrated circuit of claim 28, wherein the switching active volume comprises phase change material.

* * * * *